United States Patent [19]

Satoh et al.

[11] Patent Number: 5,177,571
[45] Date of Patent: Jan. 5, 1993

[54] LDD MOSFET WITH PARTICULARLY SHAPED GATE ELECTRODE IMMUNE TO HOT ELECTRON EFFECT

[75] Inventors: Shinichi Satoh; Wataru Wakamiya; Takahisa Eimori; Hiroji Ozaki; Yoshinori Tanaka, all of Hyogo, Japan

[73] Assignee: Mitsubishi Denki Kabushiki Kaisha, Tokyo, Japan

[21] Appl. No.: 425,017

[22] Filed: Oct. 23, 1989

[30] Foreign Application Priority Data

Oct. 24, 1988 [JP] Japan .................. 63-267364
Mar. 8, 1989 [JP] Japan .................... 1-56611

[51] Int. Cl.$^5$ .................. H01L 29/10; H01L 29/80; H01L 29/78
[52] U.S. Cl. .................. 257/336; 257/340; 257/343
[58] Field of Search .............. 357/22, 23.3, 23.4

[56] References Cited

U.S. PATENT DOCUMENTS

| 4,656,492 | 4/1987 | Sunami et al. .......... 357/23.3 |
| 4,755,479 | 7/1988 | Miura ................ 357/23.3 |
| 4,818,715 | 4/1989 | Chao ................. 357/23.3 |
| 4,837,180 | 6/1989 | Chao ................. 357/23.3 |
| 4,894,694 | 1/1990 | Cham et al. .......... 357/23.3 |
| 4,907,048 | 3/1990 | Huang ................ 357/23.3 |

FOREIGN PATENT DOCUMENTS

0073623A2  3/1983  European Pat. Off. .
0197738A2  10/1986 European Pat. Off. .
63-190377  8/1988  Japan .

OTHER PUBLICATIONS

"Fabrication of High-Performance LDDFET's with Oxide Sidewall-Spacer Technology", Tsang et al., IEEE Trans. on Elec. Dev., vol. Ed-29, #4, Apr. 1982, pp. 590-596.
"A novel submicron LDD Transistor with Inverse-T Gate Structure", Huang et al., IEDM Technical Digest, Dec. 1986, pp. 742-744.
Dennard et al., "Controllable process for Fabricating Short-Channel FET Device", *IBM Technical Disclosure Bulletin*, vol. 18, No. 8 (Jan., 1976), pp. 2743-2744.
Hori et al., "A New MOSFET with Large-Tilt-Angle Implanted Drain (LATID) Structure", *IEEE Electron Device Letters*, vol. 9, No. 6 (Jun., 1988), pp. 300-302.
Zeisler et al., "Degradationseffekte bei Kurzkanaltransistoren durch die Injektion Heisser Landungsträger in das Gateoxid und Drain Profile Engineering", *ntzArchiv* Bd. 8 (1986) H.8, pp. 191-197.

Primary Examiner—Rolf Hille
Assistant Examiner—Mahshid Saadat
Attorney, Agent, or Firm—Lowe, Price, Le Blanc & Becker

[57] ABSTRACT

Disclosed is an LDDMOSFET, in which a gate electrode (2) having a cross-sectional shape having a lower side and an upper side longer than the upper side is formed of only conductive materials, and diffusion layers (5b, 6b) of low concentration and high concentration constituting a drain are both formed so as to be overlapped with portions below the gate electrode (2) utilizing the shape of this gate electrode (2). Since the gate electrode (2) is formed of only the conductive materials, it becomes easy to word the gate electrode (2) so as to be in a desired shape. Since the diffusion layers (5b, 6b) of low concentration and high concentration constituting the drain are both overlapped with the portions below the gate electrode (2), the performance as a transistor is not degraded even if the polarity of the surface of the diffusion layer (5b, 6b) of low concentration is inverted by the effect of hot electrons.

4 Claims, 7 Drawing Sheets

LDD MOSFET WITH PARTICULARLY SHAPED GATE ELECTRODE IMMUNE TO HOT ELECTRON EFFECT

BACKGROUND OF THE INVENTION

1. Field of the Invention

The present invention relates generally to field effect type semiconductor devices and a manufacturing method therefor, and more particularly, to an improved LDDMOS (Lightly Doped Drain Metal Oxide Semiconductor) transistor and a manufacturing method therefor.

2. Description of the Background Art

A general structure of an initial field effect type MOS transistor comprises a pair of a source and a drain comprising diffusion layers of a conductivity type opposite to that of a semiconductor substrate formed at a given depth from the surface of the semiconductor substrate, and a gate comprising a conductive layer formed on the semiconductor substrate between the source and the drain through an insulating layer. In recent years, as a circuit device is miniaturized, the length between the source and the drain of the MOS transistor, that is, a channel length thereof is decreased. The MOS transistor having the above described structure accordingly presents the following problems.

An n channel MOS transistor will be described by way of example. When the n channel MOS transistor is rendered conductive, a channel occurs between a source and a drain of the n channel MOS transistor such that electrons flow from the source to the drain, that is, a drain current flows. On the other hand, a depletion layer exists in the vicinity of the drain, where the electric field strength is very high. Therefore, the electron-s which are the drain current are accelerated in the vicinity of the drain thereby to have high energy. Consequently, when the electrons having high energy collide with a crystal lattice, electrons are emitted (the electrons are referred to as hot electrons), resulting in ionization by collision by which an electron-hole pair is produced. In general, a positive potential is applied to a gate and the drain of the n channel MOS transistor and a negative potential is applied to a substrate thereof. Thus, the holes produced by ionization by collision flow into the side of the substrate while a part of the electrons produced flows into not the direction of the drain but the direction of the gate. As a result, electrons are trapped in the insulating layer formed under the gate so that the layer is negatively charged. Accordingly, there occur the problems in the use as a transistor, such as the change with time of a threshold voltage and the decrease in mutual conductance.

In order to solve the above described problems, an LDDMOS transistor has been developed. The LDDMOS transistor is currently used in a DRAM (Dynamic Random Access Memory) having a memory cell comprising a single transistor and a single capacitive device. An LDDMOS transistor currently known is disclosed in, for example, Japanese Patent Laying-Open Gazette Nos. 241375/1987 and 33470/1987 and an article entitled "Fabrication of High-Performance LDDFET'S with Oxide Sidewall-Spacer Technology", IE[3] TRANSACTIONS ELECTRON DEVICE, Vol. ED-29, No. 4, Apr. 1982, pp. 590-596.

FIG. 5A is a cross sectional view showing a structure of the LDDMOS transistor described in the above described documents. Referring to FIG. 5, this LDDMOS transistor comprises a p-type semiconductor substrate 1, a gate electrode 2 formed on a major surface of the p-type semiconductor substrate 1 through a gate insulating film 3, sidewall insulating films (sidewalls) 4 formed on sidewalls of the gate electrode 2 and the gate insulating film 3, a pair of n-type diffusion layers 5a and 5b formed on the major surface of the semiconductor substrate 1 so as to extend to portions below side portions of the gate electrode 2, and a pair of n-type diffusion layers 6a and 6b formed on the major surface of the semiconductor substrate 1 so as to extend to portions below the sidewall insulating films 4 but not to extend to the portions below the side portions of the gate electrode 2. In addition, the impurity concentration of the n-type diffusion layers 5a and 5b is lower than that of the n-type diffusion layers 6a and 6b. A source region of this transistor corresponds to the n-type diffusion layers 5b and 6b. Thus, the LDDMOS transistor is characterized in that the source/drain region is formed of two diffusion layers having different impurity concentrations.

Description is now made of a method of manufacturing the LDDMOS transistor thus constructed with reference to FIGS. 5B and 5C. Referring now to FIG. 5B, a gate insulating film 3 is formed on a major surface of a p-type semiconductor substrate 1. In addition, a gate electrode 2 is formed on the gate insulating film 3. This gate electrode 2 is formed by forming conductive materials such as polysilicon (polycrystalline silicon) or a refractory metal on the major surface of the semiconductor substrate 1 and an entire surface of the gate insulating film 3 and then, selectively removing the same by reactive ion etching utilizing a plasma reaction. Referring now to FIG. 5C, n-type impurities such as arsenic (As) are ion-implanted into the major surface of the semiconductor substrate 1 at a concentration of approximately $1 \times 10^{12}/cm^2$ to $1 \times 10^{14}/cm^2$ by self-alignment utilizing the gate electrode 2 as a part of a mask. As a result, impurity diffusion layers of low concentration are formed at a given depth from the major surface of the semiconductor substrate 1 on both sides of the gate electrode 2. Thereafter, sidewall insulating films 4 are respectively formed on both sidewall of the gate electrode 2. The sidewall insulating films 4 are formed by first forming a silicon oxide film of a constant thickness on the gate electrode 2 and the major surface of semiconductor substrate 1 and then, removing the same by anisotropic etching such as ion etching until the surface of the gate electrode 2 is exposed. Thereafter, n-type impurities such as phosphorus (P) are ion-implanted into the major surface of the semiconductor substrate 1 at a concentration of $1 \times 10^{14}/cm^2$ or more by self-alignment utilizing the gate electrode 2 and the sidewall insulating films 4 as a part of a mask. As a result, impurity diffusion layers of high concentration are formed at a given depth from the major surface of the semiconductor substrate 1 on both sides of the gate electrode 2. The implanted ions are then activated by heat treatment, so that respective one ends of the n-type diffusion layers 5a and 5b of low concentration extend to portions below side portions of the gate electrode 2 and respective one ends of the n-type diffusion layers 6a and 6b of high concentration extend to portions below side portions of the sidewall insulating films 4 but do not extend to the portions below the side portions of the gate electrode 2.

As described in the foregoing the source/drain regions of the LDDMOS transistor comprises the impurity diffusion layers of low concentration and the impurity diffusion layers of high concentration. Thus, referring to FIG. 5A, the length of extension of depletion layer which occurs in the vicinity of the drain in using the transistor becomes larger corresponding to a length μ of a deviation between the position of the impurity diffusion layer of low concentration and the position of the impurity diffusion layer of high concentration. Therefore, the electric field strength in the depletion layer of the LDDMOS transistor is decreased as compared with that of the conventional MOS transistor. As a result, the energy supplied to a drain current Id is decreased, the generation of hot electrons is suppressed and the electrons are not easily injected into the gate insulating film. However, the electric field strength in the vicinity of the n-type diffusion layers 5b and 6b constituting the drain is higher than that in the other portions. Thus, the amount of hot electrons generated in the vicinity of the drain is not zero but smaller than that of hot electrons generated in the vicinity of the drain of the conventional MOS transistor. On the other hand, the n-type diffusion layers 5b and 6b constituting the drain both extend to the portions below the sidewall insulating films 4. Therefore, the hot electrons generated are mainly trapped in the sidewall insulating films 4. The hot electrons trapped cancels and inverse the inherent polarity of the surface of the n-type diffusion layer 5b extending to the portions below the sidewall insulating films 4. Accordingly, the impurity concentration of the n-type diffusion layer 5b is effectively decreased. As a result, there occurs the problems of increasing the source resistance of the transistor and decreasing the mutual conductance gm or the like.

Furthermore, as the time period during which the transistor is used becomes longer, the amount of the hot electrons trapped in the sidewall insulating films 4 is increased. Accordingly, the effective impurity concentration of the n-type diffusion layer 5b is substantially decreased. As a result, a portion serving as the drain is only the n-type diffusion layer 6b of high concentration. This means that the drain does not extend to the portions below the gate electrode 2. As a result, a region of negative polarity which occurs under the electrode 2 by applying a positive voltage to the gate electrode 2 does not easily extend to the drain. More specifically, a channel does not easily occur between the source and the drain. Consequently, a voltage between the source and the gate. i. e., a threshold voltage $V_{TH}$ for rendering this transistor conductive is forced to be naturally increased. In addition, if the amount of hot electrons trapped in the sidewall insulating films 4 is further increased, a channel no longer easily occurs on the surface of the n-type diffusion layer 5b. That is, this transistor no longer functions as a transistor. As the result of an experiment, the above described problems become significant in manufacturing an n-channel transistor having a channel length of 1.2 μm or less and a p-channel transistor having a channel length of 0.5 to 0.8 μm or less. In order to solve the problems, an LDDMOS transistor adapted such that both diffusion layers of low concentration and high concentration constituting a pair of source drain regions to side portions of a gate electrode is disclosed in an article entitled "The Impact of Gate-Drain Overlapped LDD on VLSIs", Tech. Dig. of 1987 IE[3] IEDM, Dec. 1987, pp. 38-41.

FIG. 6 is a cross-sectional view showing a structure of the above described LDDMOS transistor. Referring to FIG. 6, this LDDMOS transistor comprises a p-type semiconductor substrate 1, a gate electrode 2 formed on the semiconductor substrate 1 through a gate insulating film 3 and comprising a polysilicon layer 2a, an oxide film 2c of polysilicon, and a polysilicon layer 2b having a length and a width smaller than those of the polysilicon layer 2a, sidewall insulating films 7 in stepped portions of the polysilicon layers 2a and 2b, a pair of n-type diffusion layers 5a and 5b of low concentration formed on a major surface of the semiconductor substrate 1 so as to extend to portions below side portions of the polysilicon layer 2a and a pair of impurity diffusion layers 6a and 6b formed on the major surface of the semiconductor substrate 1 so as to extend to the major surface of the semiconductor substrate 1 below side portions of the polysilicon layer 2a but not to extend beyond the n-type diffusion layers 5a and 5b of low concentration. The oxide film 2c is an insulating layer whose thickness is very small. Thus, electric conduction is obtained between the polysilicon layers 2a and 2b with the oxide film 2c being interposed therebetween. Description is now made assuming that a source region of this transistor comprises the n-type diffusion layer 5a of low concentration and the n-type diffusion layer 6a of high concentration and the drain region thereof comprises the n-type diffusion layer 5b of low concentration and the n-type diffusion layer 6b of high concentration.

Description is now made of a method of manufacturing the LDDMOS transistor constructed as described above.

First, a gate insulating film 3 is formed on a major surface of a semiconductor substrate 1 and a polysilicon layer 2a having a sufficiently small thickness to transmit impurities is formed on this gate insulating film 3. The surface of this polysilicon layer 2a is oxidized, to form a very thin oxide film 2c. Then, polysilicon and a resist (not shown) having a desired pattern are sequentially formed over the oxide film 2c and the entire major surface of the semiconductor substrate 1 and removed by plasma etching utilizing the resist as a mask until the oxide film 2c is exposed, to form a polysilicon layer 2b. On this occasion, the oxide film 2c serves as a stopper for preventing the polysilicon layer 2a from being etched. n-type impurities of low concentration are then implanted into the major surface of the semiconductor substrate 1 utilizing the polysilicon layer 2a is sufficiently small to transmit impurities. Thus, n-type diffusion layers 5a and 5b of low concentration (represented by broken lines) are formed at a given depth from the major surface of the semiconductor substrate 1 below a portion, on which the polysilicon layer 2b is not formed, of the polysilicon layer 2a. Sidewall insulating films 7 are then formed in stepped portions of the polysilicon layers 2a and 2b. n-type impurities of high concentration are implanted into the major surface of the semiconductor substrate 1 utilizing as a mask the sidewall insulating films 7 and the polysilicon layer 2b. Consequently, n-type diffusion layers 6a and 6b of high concentration (represented by broken lines) are formed on both sides of the polysilicon layer 2a. Finally, the implanted impurity ions are activated by heat treatment so that respective one ends of the n-type diffusion layers 5a and 5b of low concentration and respective one ends of n-type diffusion layers 6a and 6b of high concentration extend in directions represented by arrows in FIG. 6. Consequently, the n-type diffusion layers 6a and 6b of high concentration are formed on the major surface of the semiconductor substrate 1 so as to extend to portions below side portions of the polysilicon layer 2a but not to extend beyond the n-type diffusion layers 5a and 5b of low concentration. More specifically, the n-type diffusion layers 5a and 5b of low concentration (represented by solid lines) and the n-type diffusion layers 6a and 6b of high concentration (represented by solid lines) are both overlapped with the portions below the gate electrode 2.

According to the LDDMOS transistor constructed as described above, one end of each of the diffusion layers 5a and 5b of low concentration and the diffusion layers 6a and 6b of high concentration constituting the source/drain region extends to the portions below the side portions of the lower polysilicon layer 2a constituting the gate electrode 2. Therefore, even if hot electrons generated and trapped in the gate insulating film 3 and the sidewall insulating films 7 causes the impurity concentration of the diffusion layer 5b to be effectively decreased so that the drain is effectively constituted by only the diffusion layer 6b, a channel is not prevented from being formed between the source and the drain.

The conventional LDDMOS transistor shown in FIG. 6 allows the problem caused by hot electrons to be solved. However, since the width and the length of the polysilicon layer 2b constituting the gate electrode 2 are made smaller than those of the lower polysilicon later 2a, the following problems are encountered in the manufacturing processes. In forming a polysilicon layer in the upper portion of the oxide film 2c and etching the same to form the polysilicon layer 2b, the oxide film 2c functions as an etching stopper. However, in order to cause the oxide film 2c to reliably function as the etching stopper, the thickness of the oxide film 2c must be increased to a certain extent. However, if the oxide film 2c is made too thick, electric conduction between the polysilicon layers 2a and 2b is degraded, so that the polysilicon layers 2a and 2b do not integrally function as the gate electrode 2. Contrary to this, if the oxide film 2c is made too thin so as to obtain electric conduction between the polysilicon layers 2a and 2b, the oxide film 2c does not function as an etching stopper. In order to cause the oxide film 2c to perform both the above described functions, the thickness thereof must be controlled to 10 to 20 Å. It is substantially difficult to perform such control using the present manufacturing techniques. In addition, even if the thickness of the oxide film 2c can be controlled to be in the above described range, the oxide film 2c does not easily function as an etching stopper so long as etching precision at the time of formation of the polysilicon layer 2b is not increased.

Other examples of an LDDMOS transistor in which a source drain region is constituted by a double diffusion layer of high concentration and low concentration are disclosed in Japanese Patent Laying-Open Gazette Nos. 105868/1986 and 68657/1985. However, this LDDMOS transistor is only adapted such that diffusion is carried out utilizing the same mask two times, in forming an impurity layer of low concentration and an impurity layer of high concentration in the manufacturing processes thereof.

In addition, another example of an LDDMOS transistor in which a gate electrode has a two-layer structure and a source/drain region is constituted by a double diffusion layer of high concentration and low concentration is disclosed in Japanese patent Laying-Open Gazette No. 44790/1988. This LDDMOS transistor is adapted such that the width of an upper electrode portion constituting a gate electrode is larger than that of a lower electrode portion. Therefore, in the manufacture thereof, a thick oxide film layer exist between the upper electrode portion and a major surface of a semiconductor substrate. Accordingly, this LDDMOS transistor has the disadvantage in that a signal applied to the gate electrode is not easily transmitted to the semiconductor substrate due to the decrease in mutual conductance gm so that the force of on-off control of the MOS transistor is weakened.

Additionally, Japanese Patent Laying-Open Gazette No. 296740/1986 discloses an LDDMOS transistor in which an upper side portion of the cross section of a gate electrode is tapered so as to prevent disconnection of step portion of an aluminum interconnection layer on a gate electrode. Thus, the LDDMOS transistors in the above described four examples fail to solve the above described problems.

SUMMARY OF THE INVENTION

Accordingly, an object of the present invention is to provide a field effect type of semiconductor device which is not affected by hot electrons trapped in a sidewall insulating films.

Another object of the present invention is to provide a field effect type semiconductor device superior in characteristics such as mutual conductance gm.

Still another object of the present invention is to provide a field effect type semiconductor device such as an LDDMOSFET (Field Effect Transistor) which is manufactured by simple manufacturing processes.

A further object of the present invention is to provide a method of easily manufacturing a field effect type semiconductor device such as a MOSFET which is not affected by hot electrons trapped in sidewall insulating films and has good characteristics such as mutual conductance gm.

In order to attain the above described objects, the field effect type semiconductor device according to the present invention comprises a semiconductor substrate of a first conductivity type having a major surface, an insulating film formed on the major surface of the semiconductor substrate, a layer of conductive materials formed on the insulating film and having sidewall portions and a cross-sectional shape having an upper side and a lower side longer than the upper side, first diffusion layers of a second conductivity type formed on the major surface of the semiconductor substrate on both sides of the layer of conductive materials and extending in a direction of a substrate portion below side portions of the layer of conductive materials such that respective one ends thereof are overlapped with the side portions of the layer of conductive materials, second diffusion layers having impurity concentration higher than that of the first diffusion layer formed on the major surface of the semiconductor substrate on both sides of the layer of conductive materials so as to be overlapped with the first diffusion layers and extending such that respective one ends thereof are overlapped with the side portions of the layer of conductive materials but are not beyond the first diffusion layers, and sidewall insulating films formed on the sidewall portions of the layer of conductive materials.

In accordance with a preferred embodiment, the layer of conductive materials includes a lower portion having a trapezoidal cross-sectional shape and an upper portion having an elliptical cross-sectional shape, sidewall portions of the lower portion including at least a portion having a sufficient thickness to transmit impurities to be implanted, the respective one ends of the first diffusion layers extend to a substrate portion below a portion having the above described thickness of the lower portion of the layer of conductive materials, and the lower portion and the upper portion of the layer of conductive materials are integrally formed of the same layer or different layers.

In order to attain the above described objects, the LDDMOS transistor according to the present invention comprises a semiconductor substrate of a first conductivity type having a major surface, a gate insulating film formed on the major surface of the semiconductor substrate, a gate electrode formed on the gate insulating film and comprising a layer formed of only conductive materials having sidewall portions and a cross-sectional shape having an upper side and a lower side longer than the upper side, a pair of source/drain regions having first diffusion layers of a second conductivity type formed on the major surface of the semiconductor substrate on both sides of the gate electrode and extending in a direction of a substrate portion below side portions of the gate electrode such that respective one ends thereof are overlapped with the side portions of the gate electrode and second diffusion layers of a second conductivity type having impurity concentrations higher than that of the first diffusion layers formed on the major surface of the semiconductor substrate on both sides of the gate electrode so as to be overlapped with the first diffusion layers and extending such that respective one ends thereof are overlapped with the side portions of the gate electrode but are not beyond the first diffusion layers, and sidewall insulating films formed on the sidewall portions of the gate electrode.

The field effect type semiconductor device according to the present invention being thus constructed, both the first and second diffusion layers extend to the portions below the side portions of the lower side of the layer of conductive materials. Therefore, even if the impurity concentration of the first diffusion layer is effectively decreased by trapping of hot electrons in the insulating film formed in the lower part of the layer of conductive material so that the polarity of the first diffusion layers is inverted, the layer of conductive materials and the second diffusion layers are not effectively separated from each other. Thus, in the field effect type semiconductor device according to the present invention, both the diffusion layers of low concentration and high concentration formed on the major surface of the semiconductor substrate extend to the portions below the sidewall portions of the gate electrode. Accordingly, if the diffusion layers are used as an LDDMOS transistor, failure of a function caused by trapping of the hot electrons generated in the vicinity of the drain in the insulating layer is prevented. In addition, the conductive layer comprising the upper and lower portions having different shapes provided to form the diffusion layers of low concentration and high concentration are directly joined to each other without through the insulating layer. Thus, when the conductive layer is used as the gate of the transistor, a voltage applied to the gate electrode is reliably transmitted to the substrate below the gate electrode. More specifically, the problem of the poor on-off control of the transistor caused by the structure of the conventional gate electrode is solved.

In order to attain the above described objects, a method of manufacturing a field effect type semiconductor device according to the present invention comprises the steps of forming an insulating film on a major surface of a semiconductor substrate of a first conductivity type, forming on the insulating film layer of conductive materials having sidewall portions, an upper side and a lower side longer than the upper side and having a sufficient thickness to transmit impurities in the vicinity of ends of the lower side thereof, and implanting impurities of a second conductivity type into the major surface of the semiconductor substrate on both sides of the layer of conductive materials utilizing the layer of conductive materials as a part of a mask to form first diffusion layers of the second conductivity type. The implanted impurities of the second conductivity type pass through the layer of conductive materials in the vicinity of the ends of the lower side thereof, to be implanted into the semiconductor substrate below the vicinity of the ends of the lower side thereof, so that respective one ends of the first diffusion layers extend to a direction of a substrate portion below the ends of the lower side of the layer of conductive materials. A method of manufacturing the field effect type semiconductor device according to the present invention further comprises the steps of forming sidewall insulating films on the sidewall portions of the layer of conductive materials, introducing impurities of the second conductivity type into the major surface of the semiconductor substrate on both sides of the layer of conductive materials utilizing as a part of a mask the sidewall insulating films and the layer of conductive materials to form second diffusion layers having higher concentration than that of the first diffusion layers, and activating the first diffusion layer and the second diffusion which extends such that respective one ends thereof are overlapped with the ends of the lower side of the layer of conductive materials but are not beyond the first diffusion layers. In accordance with a preferred embodiment, the step of forming the layer of conductive materials comprises the steps of forming a lower portion having a trapezoidal cross-sectional shape on the insulating film and forming an upper portion having an elliptical cross-sectional shape on the lower portion, and the step of forming the layer of conductive materials comprises the steps of forming a first conductive layer on the insulating film, forming a second conductive layer on the first conductive layer, forming materials of a mask on the second conductive layer, removing the first conductive layer by anisotropic etching, removing the second conductive layer by isotropic etching, and removing the mask. Since the method of manufacturing the semiconductor device according to the present invention is constructed as described above, the first and second diffusion layers can be both formed so as to extend to the portions below the side portions of the layer of conductive materials with no insulating layer being interposed in the conductive layers. Thus, in the method of manufacturing the field effect type semiconductor device according to the present invention, the upper and lower conductive layers can be continuously etched by suitably selecting the etching conditions, so that the processes are simplified.

Accordingly, in the semiconductor device and the manufacturing method therefor according to the present invention, the original object of the field effect type semiconductor device, particularly an LDDMOS transistor, that is, the solution of the adverse effect of hot electrons to the reliability of the field effect type MOS transistor is reliably and easily achieved, thereby to reliably obtain a field effect type semiconductor device such as a miniaturized field effect type MOS transistor superior in characteristics such as mutual conductance gm and having high reliability. Thus, if the present invention is applied to a semiconductor device or the like using the field effect type semiconductor device such as the LDDMOS transistor, a semiconductor device having higher reliability than the conventional semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
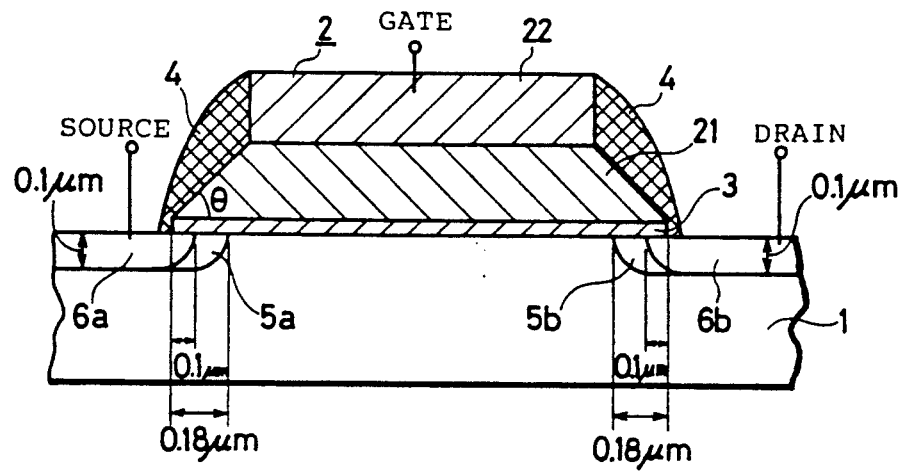
FIG. 1A is a cross-sectional view of an LDDMOS-FET according to an embodiment of the present invention.

FIG. 1A is a cross-sectional view of an LDDMOS transistor according to an embodiment of the present invention. Referring to FIG. 1A, this transistor comprises a p-type semiconductor substrate 1, a gate insulating film 3 of silicon oxide formed on a major surface of the p-type semiconductor substrate 1, a gate electrode 2 formed on the gate insulating film 3 and comprising a lower electrode 21 and an upper electrode 22 directly formed on the lower electrode, sidewall insulating films 4 of silicon oxide formed on both sidewalls of the gate electrode 2, a pair of n-type diffusion layers 5a and 5b of low concentration formed on the major surface of the semiconductor substrate 1 such that one end thereof extends to a portion below an end of the lower electrode 21, and a pair of n-type diffusion layers 6a and 6b of high concentration formed such that one end thereof extends to the portion below the end of the lower electrode 21 but does not extend beyond the pair of n-type diffusion layers 5a and 5b of low concentration.

According to the present embodiment, each of the n-type diffusion layers 5a and 5b of low concentration and a portion below a side portion of the lower electrode 21 are overlapped with each other by approximately 18 μm, each of the n-type diffusion layers 6a and 6b of high concentration and the portion below the side portion of the lower electrode 21 are overlapped with each other by approximately 0.1 μm, the depth of each of the n-type diffusion layers 5a and 5b and 6a and 6b is approximately 0.1 μm, the impurity concentration of the n-type diffusion layers 5a and 5b and the impurity concentration of the n-type diffusion layers 6a and 6b are approximately $10^{178}$/cm$^2$ and $20^{20}$/cm$^2$, respectively, and the impurity concentration of the p-type semiconductor substrate 1 is approximately $10^{16}$/cm$^2$.

Furthermore, in the present embodiment, the lower electrode 21 constituting the gate electrode 2 is formed of polysilicon which has a thickness of 2000 Å and is a trapezoid in cross section having a lower side of 1.18 μm and an end at an angle θ of 45° to the major surface of the semiconductor substrate 1, the upper electrode 22 is formed of a refractory metal film (for example, MoSi$_2$) which has a thickness of 2000 Å and is a rectangle in cross section and the gate insulating film 3 has a thickness of 200 Å.

As described in the foregoing, in this transistor, the n-type diffusion layers 5b and 6b constituting a drain both extend to portions below side portions of the lower electrode 22 constituting the gate electrode 2. Thus, even if the impurity concentration of the n-type diffusion layer 5b of low concentration is effectively decreased by trapping of hot electrons generated in the sidewall insulating films 4 and the gate insulating film 3, the gate electrode 2 is overlapped with the drain into n-type diffusion layer 6b of high concentration. Thus, the above described various problems encountered by the effective decrease of the concentration of the n-type diffusion layer of low concentration are solved. In addition, since no insulating layer exist between the upper electrode 22 and the lower electrode 21 constituting the gate electrode 2, electric conduction between the upper electrode 22 and the lower electrode 21 is not prevented. Accordingly, the gate electrode 2 satisfactorily performs its function.

Description is now made of a method of manufacturing this transistor. FIGS. 1B to 1F are diagrams showing the step of manufacturing the transistor.

Figure 1B:
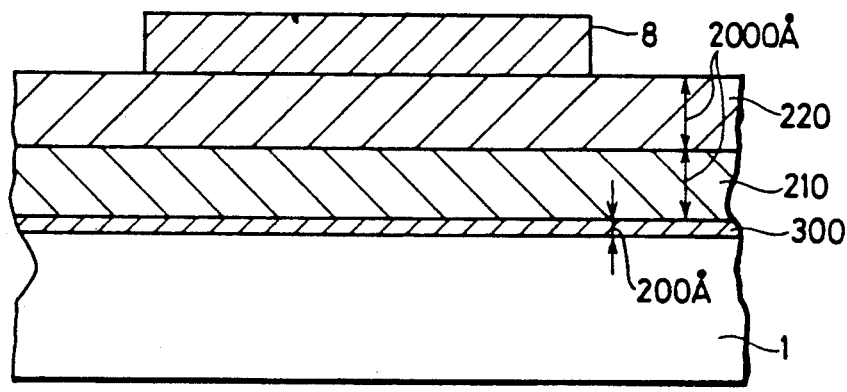
FIGS. 1B to 1F are cross-sectional views showing the steps of manufacturing the LDDMOSFET according to an embodiment of the present invention.

Referring now to FIG. 1B, a silicon oxide film 300 having a thickness of 200 Å to be a gate insulating film 3, a polysilicon film 200 having a thickness of 200 Å to be a lower electrode 2, and a refractory metal film 220 having a thickness of 200 Å to be an upper electrode 22 are sequentially formed on the major surface of p-type conductor substrate 1. Furthermore, a resist film 8 to be a mask for forming a gate electrode 2 is selectively formed on the surface of the refractory metal film 220.

Figure 1C:
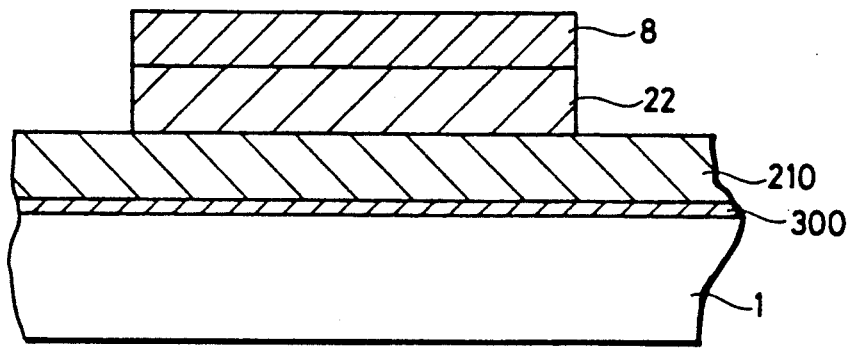

Referring now to FIG. 1C, the refractory metal film 22 is subjected to anisotropic etching utilizing a resist film 8 as a mask, to form the upper electrode 22. It is necessary to make this etching by the active ion etching whose anisotropy is increased by using a gas including chlorine such as CL$_2$ or HCL under rather low pressure of, for example, approximately 0.05 Torr and utilizing a physical reaction or physical and chemical reactions.

Figure 1D:
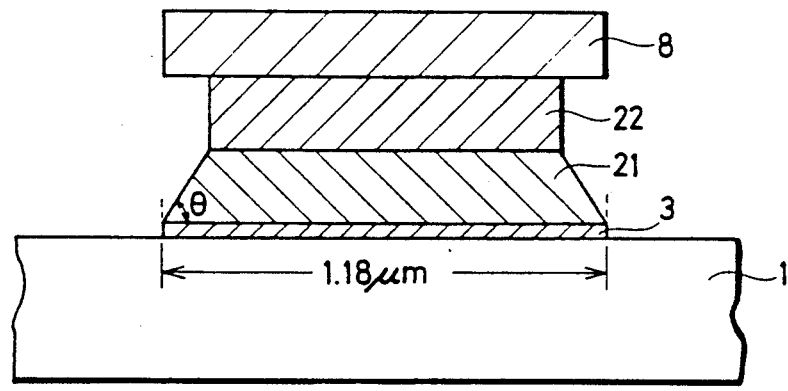

Referring now to FIG. 1D, the polysilicon film 210 and the insulating film 300 are subjected to isotropic etching utilizing the resist film 8 as a mask, to form the gate insulating film 3 and the lower electrode 21. On this occasion, portions, which are close to ends of the resist film 8, of the upper electrode 22 are slightly cut by the isotropic etching. Thus, the upper electrode 22 finally takes the form as shown in FIG. 1D. It is necessary to make this etching by reactive ion etching whose isotropy is increased using CF$_4$ or CF$_4$ or O$_2$ under pressure of approximately 0.6 Torr and mainly utilizing a chemical reaction.

Figure 1E:
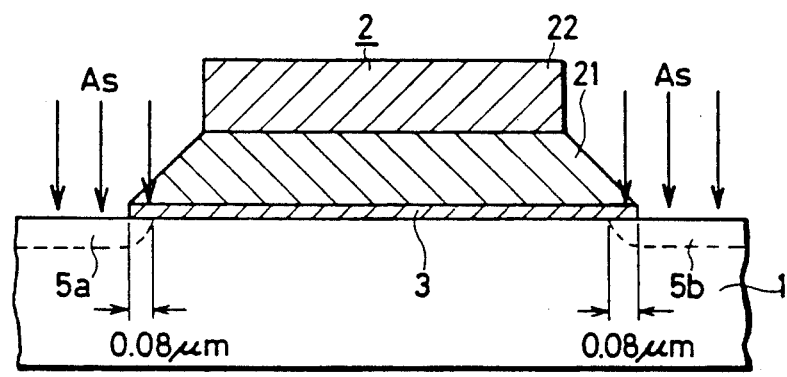

Referring now to FIG. 1E, the resist film 8 is removed and the same, arsenic (As) which is an n-type impurity is vertically implanted into the major surface of the semiconductor substrate 1 at 100KeV. On this occasion, the gate electrode 2 functions as a part of the mask, so that arsenic is implanted into major surface of the semiconductor substrate 1 by self-alignment with the gate electrode 2. However, since the thickness of ends of the lower electrode 21 constituting the gate electrode 2 is sufficiently small to transmit impurities by ion implantation, arsenic passage through the thin ends. When arsenic is implanted at 100 KeV, it is clear by an experiment that the thickness of a portion, through which arsenic can pass, of the lower electrode 21 formed of polysilicon is 1000 Å or less including the thickness 200 Å of the insulating film 3. On the other hand, the angle of each of the ends of the lower electrode 21 to the major surface of the semiconductor substrate 1 is 45° Accordingly, the n-type diffusion layers 5a and 5b formed by implantation of arsenic are overlapped with the lower electrode 21 in positions of 0.08 μm inward from portions below the ends of the lower electrode 21.

Figure 1F:
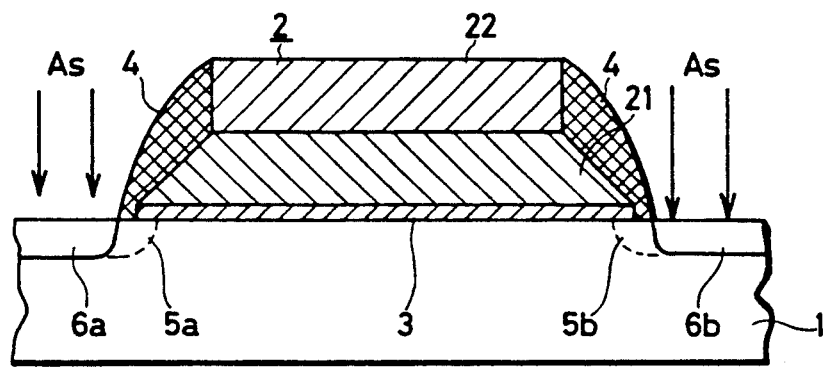

Thereafter, a silicon oxide film of constant thickness is formed on the gate electrode 2 and the major surface of the semiconductor substrate 1, to remove the same using an anisotropic reactive ion etching until the major surface of the semiconductor substrate 1 and the surface of the upper electrode 22 are exposed. As a result, as shown in FIG. 1F, sidewall insulating films 4 formed of silicon oxide is formed on both sidewalls of the gate electrode 2. Arsenic is implanted into the major surface of the semiconductor substrate 1 by self-alignment utilizing as a part of the mask the sidewall insulating films 4 and the gate electrode 2 so as to have higher concentration than that of the n-type diffusion layers 5a and 5b.

Finally, the n-type diffusion layers 5a and 5b and 6a and 6b are activated by heat treatment. As a result, the n-type diffusion layers 5a and 5b, and 6a and 6b are respectively overlapped with the portions below the ends of the lower electrode 21 by 0.18 μm and 0.1 μm, respectively, and have a depth of 0.1 μm from the major surface of the semiconductor substrate 1. Accordingly, a transistor having a cross-sectional shape as shown in FIG. 1A is obtained.

As described in the foregoing, in the manufacturing process of the transistor shown in FIG. 1A, the upper electrode 22 and the lower electrode 21 constituting the gate electrode 2 are formed of different materials. Thus, if etching is made under the different etching conditions in forming the upper and lower electrodes 21 and 22 are gate electrode in a shape shown in FIG. 1A, 1D, 1E, and 1F is easily obtained. More specifically, an oxide film for an etching stopper need not be provided between the two electrodes constituting the gate electrode. As a result, control of the thickness of the oxide film as described in Description of the Background Art is not required. More specifically, this transistor is manufactured by simple manufacturing processes.

Although in the present embodiment, the lower electrode 21 constituting the gate electrode 2 is formed of a polysilicon film and the upper electrode is formed a refracted in a metal film, the lower electrode 21 may be formed of a polysilicon film including impurities such as phosphorus and the upper electrode 22 may be formed of a polysilicon film including impurities such as phosphorus having higher impurity concentration than that of the lower electrode 21. In general, in maxing etching, a polysilicon film of high impurity concentration is removed by isotropic etching more easily than a polysilicon film of low impurity concentration. Thus, considering a case in which the gate electrode thus constructed is formed, if conductive layers in the upper portion and the lower portion are removed by reactive ion etching under the same etching conditions, the cross-sectional shape of the gate electrode can be set to the same as that shown in FIG. 1A.

Figure 2:
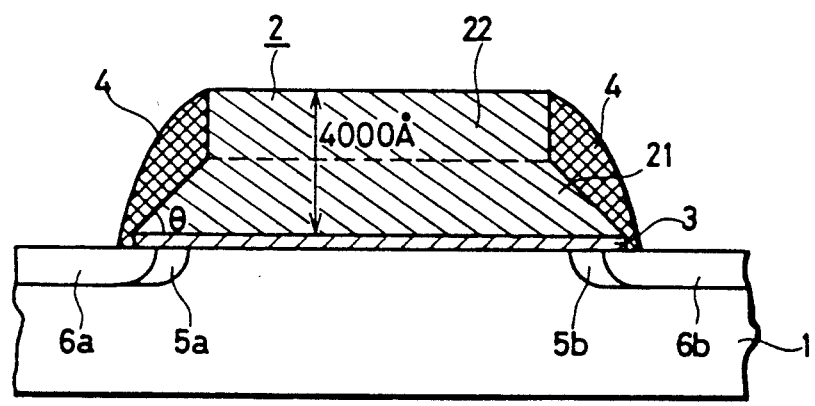
FIG. 2 is a cross-sectional view of an LDDMOSFET according to another embodiment of the present invention.

Additionally, the upper electrode and the lower electrode may be formed of all the same material. FIG. 2 is a cross-sectional view of an LDDMOS transistor according to another embodiment of the present invention. Referring to FIG. 2, this transistor comprises a p-type semiconductor substrate 1, a gate insulating film 3 formed on a major surface of the semiconductor substrate 1, a gate electrode 2 formed of a polysilicon on the gate insulating film 3, sidewall insulating film 4 in both side portions of the gate electrode 2, n-type diffusion layers 5a and 5b of low concentration formed on the major surface of the semiconductor substrate 1 such that respective one ends thereof extend to portions below the side portions of the gate electrode 2, and n-type diffusion layers 6a and 6b of high concentration formed such that respective one ends thereof extend to the portions below the side portions of the gate electrode 2 but do not extend beyond the n-type diffusion layers 5a and 5b of low concentration. This transistor is the same as the transistor according to the above described embodiment (see FIG. 1A) except that the upper end lower portions of the gate electrode are formed the same material.

Description is now made of a method of manufacturing this transistor. First, an insulating film having a thickness of 200 Å to be a gate insulating film, a polysilicon layer having a thickness of 4000 Å, and a resist film are sequentially formed on the surface of the semiconductor substrate 1. An upper portion, having a thickness of 2000 Å, of the polysilicon layer is then removed by reactive ion etching whose an isotropy is increased utilizing this resist film as a mask. Subsequently, a lower portion, having a thickness of 200 Å, of the polysilicon layer is removed by reactive ion etching whose isotropy is increased. Consequently, the cross-sectional shape of the gate electrode 2 is the same as that in the above described embodiment shown in FIG. 1A.

Although in the above described two embodiments, the n-type diffusion layers 5a and 5b and 6a and 6b are formed by implantation of arsenic, they may be formed by implantation of other ions such as phosphorus. In addition, the n-type diffusion layers 5a and 5b may be formed by implantation of arsenic and the n-type diffusion layers 6a and 6b may be formed by implantation of phosphorus. More specifically, the impurity diffusion layers of high concentration and low concentration constituting a source/drain region may be formed by implantation of different ion.

Furthermore, if should be noted that ion implantation energy informing the n-type diffusion layers 5a and 5b and 6a and 6b is not limited to a value 100 keV in the above described embodiments. In addition, although in the above described two embodiments, the angle of ion implantation is set to an angle of 90° to the major surface of the semiconductor substrate 1, the angle of ion implantation is not limited to the value. More specifically, it is necessary to set values such satisfying the conditions under which the field effect type semiconductor device such as LDDMOS transistor according to the present invention can be obtained.

Additionally, it should be noted that the cross-sectional shape of the gate electrode 2 is not limited to the shape shown in the above described two embodiments. For example, the gate electrode 2 may have a cross-sectional shape having an upper side and a lower side longer than the upper side, the thickness of the side portions of the lower electrode thereof having a sufficient thickness to transmit impurities.

Thus, it should be noted that the respective depths of the n-type diffusion layers 5a and 5b and 6a and 6b and the length of overlapped of each the n-type diffusion layers 5a and 5b and 6a and 6b with a portion below the side portion of the gate electrode 2 are not limited to the values in the above described two embodiments. For example, the values can be freely set by changing ion implantation energy, the angle of ion implantation, ions, the material of the gate electrode 2, and the cross-sectional shape of the gate electrode 2. Description is now made of a relation between ion implantation energy and the cross-sectional shape of the gate electrode 2, and the shapes (profiles) of the n-type diffusion layers 5a and 5b (6a and 6b).

Figure 3:
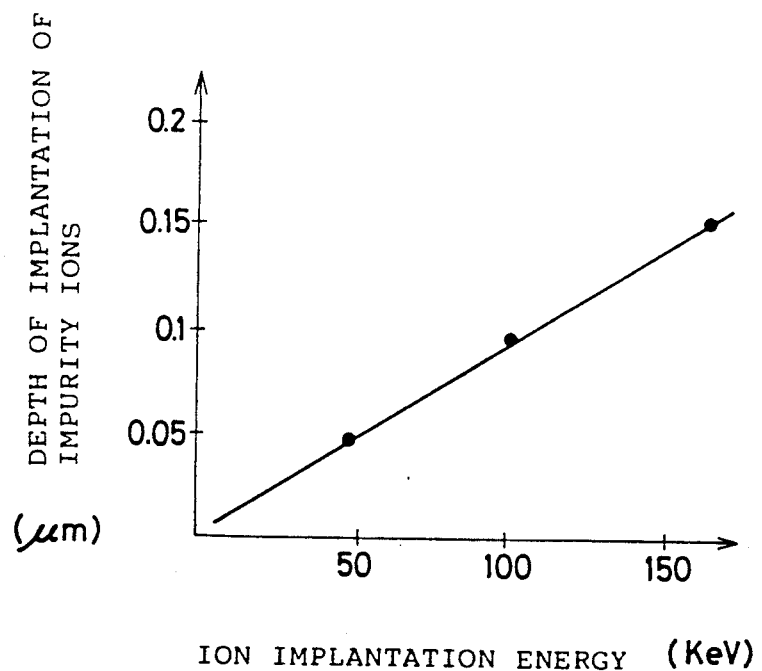
FIG. 3 is a graph showing a general relation between ion implantation energy and the depth of ion implantation in implanting ions into a silicon substrate.

FIG. 3 is a graph showing the relation between implantation energy and the depths from the surface of a silicon substrate at which impurity ions reached by implantation in a case in which impurities are added to the silicon substrate by ion implantation. In FIG. 3, the axis of abscissa represents ion implantation energy and the axis of ordinate represents the depths at which impurity ions are implanted. FIG. 3 shows a case in which an ion to be implanted is arsenic As$^+$ and As$^+$ is implanted at an angle of 90° to the substrate. As shown in FIG. 3, the ion implantation energy is proportional to the depths at which impurity ions are implanted. Thus, the respective depths of the diffusion layers 5a and 5b and 6a and 6b from the major surface of the semiconductor substrate 1 can be controlled by changing the ion implantation energy.

Figure 4:
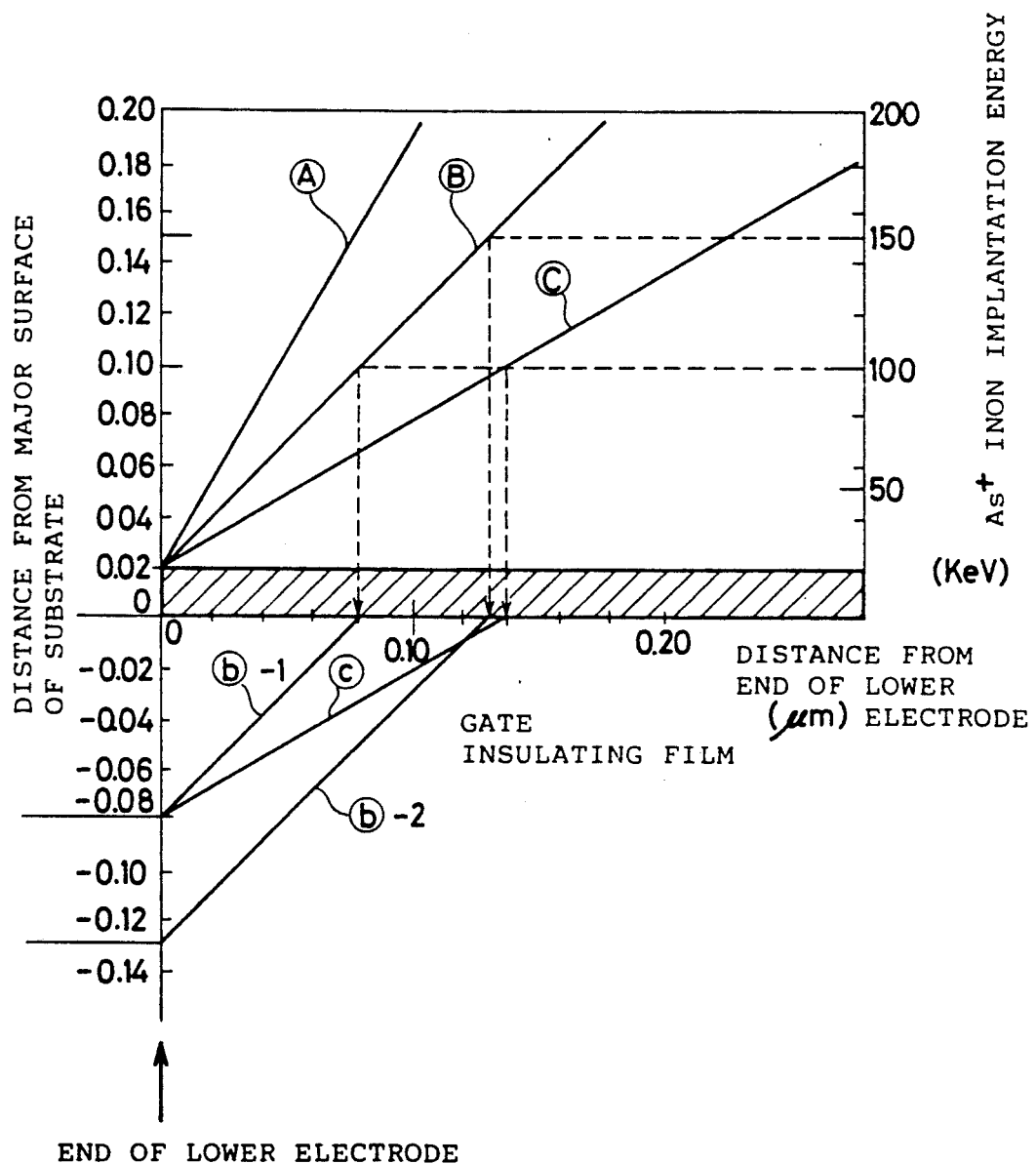
FIG. 4 is a diagram showing a relation between the shape of a lower electrode and the profile of impurity diffusion layers of low concentration.
Figure 5A:
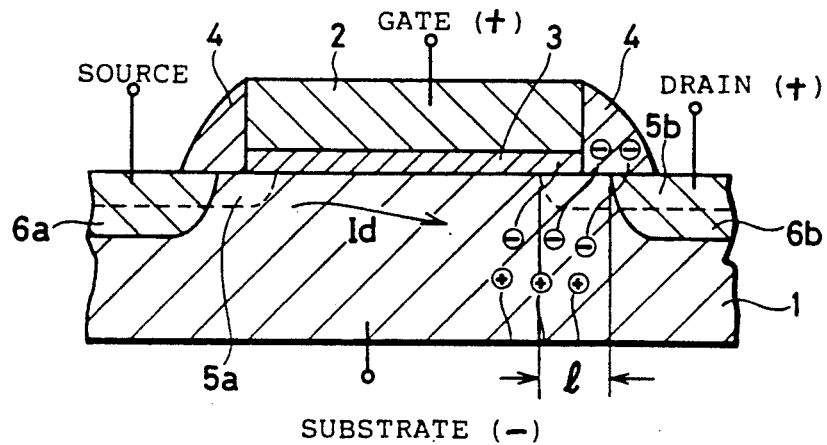
FIG. 5A is a cross-sectional view of a conventional LDDMOSFET.
Figure 5B:
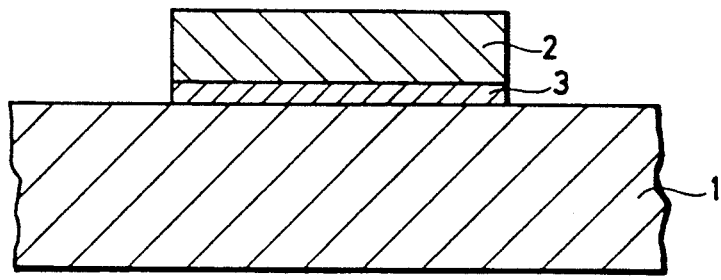
FIGS. 5B to 5C are cross-sectional views showing the steps of manufacturing the LDDMOSFET shown in FIG. 5A.
Figure 5C:
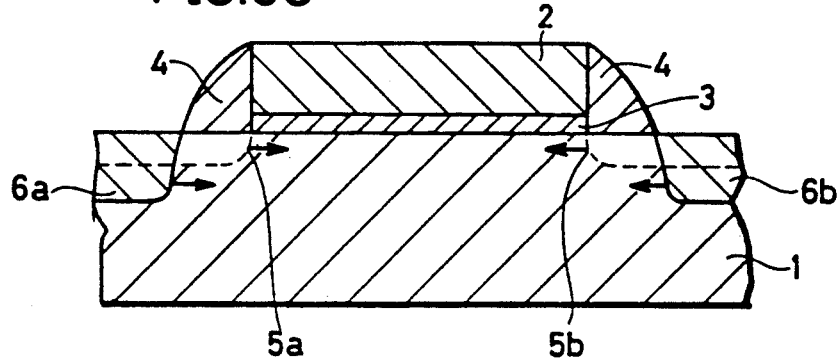
Figure 6:
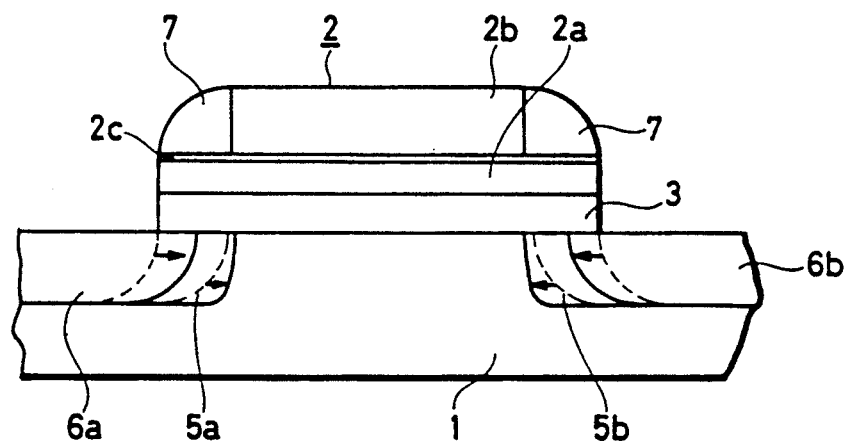
FIG. 6 is a cross-sectional view of another conventional LDDMOSFET.

FIG. 4 is a diagram showing a relation between the shape of the lower electrode 21 and a profile of the diffusion layers 5a and 5b obtained by calculation assuming that the material of the lower electrode 21 is polysilicon, and ion to be implanted is arsenic and the direction of implantation is perpendicular to the major surface of the semiconductor substrate 1. In FIG. 4, the axis of abscissa represents the distance from the major surface of the semiconductor substrate 1 and ion implantation energy and the axis of ordinate represents the distance from an end of the lower electrode 21. Thus, a portion (a hatched portion in FIG. 4) where the distance from the major surface of the semiconductor substrate 1 in the range of 200 ↑ (=0.02 μm) represents the gate insulating film 3, and an intersection of the axis of abscissa and the axis of ordinate, i.e., an origin represents the end of the lower electrode 21. In FIG. 4, straight lines A, B and C indicate a relation between ion implantation energy and a position where the end of each of the diffusion layers 5a and 5b and a portion a below a side portion of the lower electrode 21 are overlapped with each other in a case in which the angle $\theta$ of the end of the lower electrode 21 to the major surface of the semiconductor substrate 1 is 60°, 45° and 30°, respectively. As obvious from the foregoing, the diffusion layers 5a and 5b to be formed enter the portions below the electrode 21, that is, the position where each of the diffusion layers 5a and 5b and the portion below the lower electrode are overlapped with each other is shifted right in FIG. 4, in proportion to the increase in ion implantation energy. The reason for this is that the thickness of end portions of the lower electrode 21 becomes larger as the distance from an end thereof is increased, and a limit value of the thickness of a film through which ion can pass becomes larger as ion implantation energy is increased. On the other hand, the thickness of the end portion of the lower electrode 21 differs depending on the angle on the major surface of the semiconductor substrate 1. Thus, even in the case of the same ion implantation energy, the larger the angle of the end of the lower electrode 21 to the major surface of the semiconductor substrate 1 is, the smaller the degree of overlapped between each of the diffusion layers 5a and 5b formed and the lower electrode is. Thus, when the ion implantation energy 100 keV as in the above described two embodiments, the degree of overlapped between each of the diffusion layers 5a and 5b and the lower electrode 21 is 0.08 μm if the above described angle $\theta$ is 45° while being 0.14 μm if the angle $\theta$ is 30°. In addition, on this occasion, the depth of each of the diffusion layers 5a and 5b from the major surface of the semiconductor substrate 1 is (b)0 −1 (in the case of $\theta$=45°) and (c)0 (in the case of=30°) depending on the distance from the end of the lower electrode 21. As obvious from the foregoing, when the angle $\theta$ is set to 45°, the diffusion layers 5a and 5b are formed from the end of the lower electrode 21 to a position at a distance of 0.08 μm therefrom, so that the depth of each of the diffusion layers 5a and 5b is gradually larger until the diffusion layer reaches the end of the lower electrode 21, to be a constant value of 0.08 μm in the end of the lower electrode 21 and outside the thereof (a portion where it does not overlapped with the lower electrode). Then, when the angle $\theta$ is 35°, the diffusion layers 5a and 5b are formed from the end of the lower electrode 21 to a position at a distance of approximately 0.14 μm therefrom, so that the depth of each of the diffusion layers 5a and 5b is 0.08 μm in the end of the lower electrode 21. In addition, considering a case in which ion implantation energy is increased to 150 keV, if $\theta$=45°, the diffusion layers 5a and 5b are formed from the end of the lower electrode 21 to a position at a distance of 0.13 μm therefrom, so that the depth of each of the diffusion layers 5a and 5b is gradually larger until the diffusion layer reaches the end of the lower electrode 21, to be a constant value of 0.13 μm in the end of the lower electrode 21 and outside thereof (see (b)0 −2 in FIG. 4).

As shown in the above described examples, it is found that the depth of each of the diffusion layers 5a and 5b and the degree of overlapped of each of the diffusion layers with the portion below the gate electrode can be freely selected even by combining the ion implantation energy with the shape of the lower electrode, i.e, the shape of the gate electrode as parameters.

It should be noted that the thickness of the gate insulating film, the lower electrode, and the upper electrode are not respectively limited to the values in the above described two embodiments but a arbitrarily set according to purposes of use or the like. For example, it is necessary that the thickness of the gate insulating film is a sufficient value to perform a function of insulating a substrate and the gate electrode and transmitting a potential applied to the gate to the substrate. The thickness of the gate insulating film, which affects the profile of the diffusion layers of low concentration similarly to the above described parameters, must be set in consideration of the profile of the diffusion layers of low concentration.

Additionally, it should be noted that the shape of a sidewall insulating films is not limited to the shape in the above described embodiments. In addition, since the sidewall insulating films function as a mask in forming diffusion layers of high concentration, the shape of the sidewall insulating films must the shape taken such that the ends of the diffusion layers of high concentration extend to the portions below the side portions of the lower electrode by heat treatment.

Although in the above described two embodiments, description was made of an n channel transistor, the field effect type semiconductor device according to the present invention may be applied to a p-channel transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect type semiconductor device, comprising:
    a semiconductor substrate of a first conductivity type having a major surface;
    an insulating film formed on said major surface of said semiconductor substrate;
    a layer formed of only conductive materials formed on said insulating film and having sidewall portions and a crosssectional shape having an upper side and a lower side longer than the upper side;
    first diffusion layers of a second conductivity type formed on said major surface of said semiconductor substrate below said sidewall portions of said layer of conductive materials;
    second diffusion layers formed on said major surface of said semiconductor substrate adjacent both sides of said layer of conductive materials and extending beneath said layer of conductive materials such that respective one ends of said second diffusion layers overlap said sidewall portions of said layer of conductive materials and do not extend beyond said first diffusion layers; and
    sidewall insulating films formed on the entire sidewall portions of said layer of conductive material;
    wherein the impurity concentration of said second diffusion layers is higher than that of said first diffusion layers and the depth of the first diffusion layers is not greater than the depth of the second diffusion layers.

2. A field effect type semiconductor device comprising:
    a semiconductor substrate of a first conductivity type having a major surface;
    an insulating film formed on said major surface of said semiconductor substrate;
    a layer formed of only conductive materials formed on said insulating film and having sidewall portions and a crosssectional shape having an upper side and a lower side longer than the upper side;
    first diffusion layers of a second conductivity type formed on said major surface of said semiconductor substrate below said sidewall portions of said layer of conductive materials;
    second diffusion layers formed on said major surface of said semiconductor substrate adjacent both sides of said layer of conductive materials and extending beneath said layer of conductive materials such that respective one ends of said second diffusion layers overlap said sidewall portions of said layer of conductive materials and do not extend beyond said first diffusion layers; and
    sidewall insulating films formed on the entire sidewall portions of said layer of conductive material;
    wherein the impurity concentration of said second diffusion layers is higher than that of said first diffusion layers and the depth of the first diffusion layers is not greater than the depth of the second diffusion layers and wherein
    said layer of conductive materials includes a lower portion having a trapezoidal cross-sectional shape and an upper portion having a rectangular cross-sectional shape, and each of the sidewall portions of said lower portion includes at least a portion having a sufficient thickness to transmit impurities to be implanted; and
    said respective ends of said first diffusion layers extend to a substrate portion below the portion having said thickness in said lower portion of said layer of conductive materials.

3. A field effect type semiconductor device according to claim 2, wherein said lower portion and said upper portion of said layer of conductive materials are formed of the same layer.

4. A field effect type semiconductor device according to claim 2, wherein said lower portion and said upper portion of said layer of conducting materials are integrally formed of different layers.

* * * * *